(12) United States Patent
Chase

(10) Patent No.: US 8,707,065 B2
(45) Date of Patent: *Apr. 22, 2014

(54) METHOD AND SYSTEM FOR MONITORING MODULE POWER STATUS IN A COMMUNICATION DEVICE

(75) Inventor: Bryan Chase, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 214 days.

This patent is subject to a terminal disclaimer.

(21) Appl. No.: 13/037,579

(22) Filed: Mar. 1, 2011

(65) Prior Publication Data

US 2011/0202779 A1    Aug. 18, 2011

Related U.S. Application Data

(63) Continuation of application No. 10/933,371, filed on Sep. 2, 2004, now Pat. No. 7,900,065.

(60) Provisional application No. 60/577,263, filed on Jun. 4, 2004.

(51) Int. Cl.
    *G06F 1/00* (2006.01)

(52) U.S. Cl.
    USPC .......................................................... 713/300

(58) Field of Classification Search
    USPC .......................................................... 713/300
    See application file for complete search history.

(56) References Cited

U.S. PATENT DOCUMENTS

| | | | |
|---|---|---|---|
| 4,677,566 A | 6/1987 | Whittaker et al. | |
| 4,845,420 A | 7/1989 | Oshizawa et al. | |
| 5,113,089 A | 5/1992 | Osawa | |
| 5,367,300 A | 11/1994 | Fong et al. | |
| 5,764,739 A | 6/1998 | Patton et al. | |
| 5,854,908 A | 12/1998 | Ogilvie et al. | |
| 5,870,541 A * | 2/1999 | Tamura | 714/47.1 |
| 5,945,817 A * | 8/1999 | Nguyen | 323/273 |
| 5,963,015 A | 10/1999 | Lee | |
| 6,052,746 A * | 4/2000 | Kalluri et al. | 710/38 |
| 6,529,064 B2 | 3/2003 | Hachmeister | |
| 6,642,852 B2 | 11/2003 | Dresti et al. | |
| 6,684,338 B1 | 1/2004 | Koo | |

(Continued)

OTHER PUBLICATIONS

Regan. "Current Sense Circuit Collection". Dec. 2005. Linear Technology.*

*Primary Examiner* — Kim Huynh
*Assistant Examiner* — Eric Chang
(74) *Attorney, Agent, or Firm* — Sterne, Kessler, Goldstein & Fox P.L.L.C.

(57) ABSTRACT

A method for monitoring operating status of a device includes receiving within a chip, a plurality of signals, each of the plurality of signals being indicative of a power status of a respective one of a plurality of on-chip devices. The method may also include generating from within the chip, a corresponding plurality of output signals. Each of the corresponding plurality of output signals respectively being indicative of the power status of the respective one of the plurality of on-chip devices. Each of the corresponding plurality of output signals may include a clock signal and a data signal. The corresponding plurality of output signals that are indicative of the power status may be output from the chip in a round robin manner. Each of the output signals that are indicative of the power status may be measured in real time by one or more resistor drops within the chip.

24 Claims, 6 Drawing Sheets

(56) References Cited

U.S. PATENT DOCUMENTS

| | | |
|---|---|---|
| 6,732,301 B1 | 5/2004 | Landry et al. |
| 6,842,144 B2 | 1/2005 | Guo et al. |
| 6,904,533 B2 | 6/2005 | Kuo et al. |
| 6,986,074 B2 | 1/2006 | Alia et al. |
| 7,055,046 B2 | 5/2006 | Malueg et al. |
| 7,178,044 B2 * | 2/2007 | Pappalardo et al. .......... 713/300 |
| 7,240,225 B2 | 7/2007 | Brewer et al. |
| 7,346,788 B2 | 3/2008 | Chase |
| 7,551,428 B2 | 6/2009 | Homer et al. |
| 7,609,049 B1 | 10/2009 | Tian et al. |
| 7,836,315 B2 | 11/2010 | Chase |
| 7,900,065 B2 | 3/2011 | Chase |
| 2007/0234096 A1 | 10/2007 | Chase |
| 2011/0066867 A1 | 3/2011 | Chase |

* cited by examiner

METHOD AND SYSTEM FOR MONITORING MODULE POWER STATUS IN A COMMUNICATION DEVICE

CROSS-REFERENCE TO RELATED APPLICATIONS/INCORPORATION BY REFERENCE

This application is a continuation of U.S. application Ser. No. 10/933,371 filed Sep. 2, 2004, which makes reference to, claims priority to, and claims the benefit of U.S. Provisional Application Ser. No. 60/577,263 filed Jun. 4, 2004 and entitled "Method And System For Monitoring Module Power Status In A Communication Device."

The above stated application is hereby incorporated herein by reference in its entirety.

FIELD OF THE INVENTION

Certain embodiments of the invention relate to monitoring operating status of a communication device. More specifically, certain embodiments of the invention relate to a method and system for monitoring power status of various modules in a communication device such as a wireless handset.

BACKGROUND OF THE INVENTION

Power usage is an important factor in wireless communications, especially for mobile communication devices that have a very limited battery capacity. With on-going development of wireless technology, there is a constant effort to reduce power consumption on these mobile communication devices such as wireless handsets. Reduction of power consumption in a wireless handset may necessitate reduction in the real estate of the silicon on a chip. In addition, power consumption within the chip may need to be analyzed so that more optimal use of the power resources within a wireless handset is accomplished.

A conventional method of analyzing power consumption within a chip is by utilizing liquid crystals. In this regard, a chip may be decapped by removing the plastic cover from its top and depositing liquid crystals on the surface of the decapped chip. The chip may then be powered-up and configured to operate in a certain operating mode. Certain modules within the chip may utilize excessive power due to, for example, being turned on for a prolonged period of time. Due to the continuous or increased power consumption in such module, the liquid crystal just above the module may begin to boil and form bubbles. The boiling of the liquid crystal above the module may lead to discoloration and the appearance of "spots" over the module with excessive power consumption. In this way, the specific module with excessive power consumption may be identified under a microscope and proper adjustments may be performed on the module and/or the chip. If, on the other hand, there are no modules within the chip that are characterized with excessive power consumption, the liquid crystal hardens uniformly without any "spots" or discolorations.

While this conventional method may be effective in analyzing power consumption within a chip, it is very impractical and time-consuming since the chip has to be separated from the handset, placed on a special board, decapped, covered with liquid crystal, powered-up and then analyzed under a microscope. Furthermore, it is very difficult to effectively perform such operations while the device is in operation. Additionally, issues with power consumption manifest themselves during operation.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain aspects of the invention may be found in a method and system for monitoring operating status of a device. Aspects of the method may include receiving within a chip, a signal indicative of a power status of an on-chip device. An output signal indicative of the power status may be generated from within the chip, while the chip is operating. The generated output signal may be communicated outside the chip via a serial bus, a plurality of pin connections on the chip, and/or a general purpose input/output connection. The generated output signal may be multiplexed on at least one pin on the chip and it may comprise a clock signal and/or a data signal. The data signal may comprise sequential power status information for a plurality of on-chip devices.

Another aspect of the method may include, after acquiring a first signal indicative of the power status of the on-chip device, a second signal indicative of the power status of the on-chip device may also be acquired. A difference may be determined between the first signal and the second signal and the determined difference may be reported if it is non-zero. The second signal indicative of the power status of the on-chip device may also be reported, if the determined difference is non-zero.

The system for monitoring operating status of a device may comprise at least one resistor that generates within a chip a signal indicative of a power status of an on-chip device, where the resistor may be coupled to a power rail within the chip. A power analyzer may receive within the chip the signal indicative of the power status. The power analyzer may generate from within the chip, an output signal indicative of the power status while the chip is operating. A serial interface may communicate the signal indicative of the power status to the power analyzer. The power analyzer may communicate the generated output signal outside the chip via a serial bus, a plurality of pin connections on said chip, and/or via a general purpose input/output connection.

The power analyzer may multiplex the generated output signal on at least one pin on the chip. The generated output signal may comprise a clock signal and/or a data signal. The data signal may comprise sequential power status information for a plurality of on-chip devices. After the power analyzer acquires a first signal indicative of the power status of the on-chip device, the power analyzer may acquire a second signal indicative of the power status of the on-chip device. The power analyzer may determine a difference between the first signal and the second signal and it may report the determined difference if the determined difference is non-zero. The power analyzer may also report the second signal indicative of the power status of the on-chip device if the determined difference is non-zero.

These and other advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for monitoring operating status of a device, such as a wireless handset for example. A signal indicative of a power status of an on-chip device may be received by a power analyzer module within a chip. An output signal indicative of the received power status may be generated within the chip, while the chip is operating. The signal indicative of the power status may be communicated outside the chip via a serial bus, via separate output pins, and/or via general purpose input/output pins. The power status signal may then be processed by an external processing system such as a computer (PC). The PC may display a list, for example, of the devices within the chip that utilize the most power. Other processing may be applied once the signal indicative of power status is communicated outside the chip.

Figure 1:
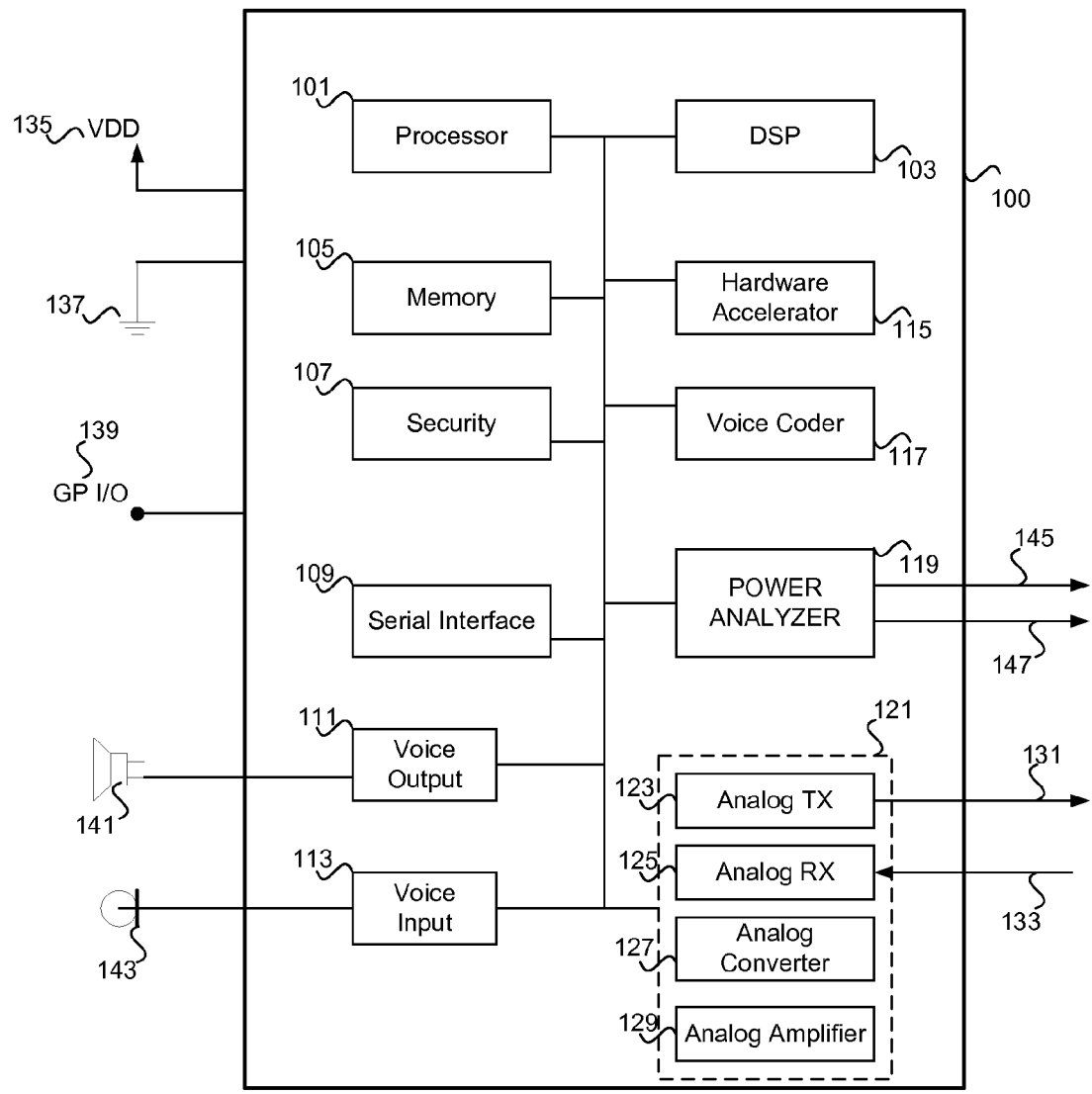
FIG. 1 is a block diagram of an exemplary chip architecture that may be utilized in accordance with an embodiment of the invention.

FIG. 1 is a block diagram of an exemplary chip architecture that may be utilized in accordance with an embodiment of the invention. The chip 100 may comprise a processor 101, a digital signal processor (DSP) 103, memory 105, a hardware accelerator module 115, a security module 107, a voice coder module 117, a serial interface 109, a power analyzer module 119, a voice output module 111, a voice input module 113 and an analog processing module 121. The analog processing module 121 may comprise an analog transmit (TX) module 123, an analog receive (RX) module 125, an analog converter 127 and an analog amplifier 129.

The chip 100 may be connected to a voltage source $V_{DD}$ 135 and a ground connection 137. The chip 100 may receive and output signals via general purpose input/output (GPIO) pins 139. The voice output module 111 may be adapted to generate output audio signals to a speaker 141. The voice input module 113 may be adapted to receive voice signals via a microphone 143. The analog TX module 123 may be adapted to transmit an analog signal 131, and the analog RX module 125 may be adapted to receive an analog signal 133, which may subsequently be processed by the analog converter 127 and the analog amplifier 129.

The hardware accelerator module 115 may comprise suitable circuitry, logic and/or code that may be adapted to perform channel coding within the chip 100. The voice coder module 117 may comprise suitable circuitry, logic and/or code that may be adapted to perform voice coding within the chip 100. The power analyzer module 119 may comprise suitable circuitry, logic and/or code that may be adapted to receive power status information related to modules within the chip 100.

In operation, the power analyzer module 119 may obtain power status information associated with modules within the chip 100. For example, power status and power consumption may be individually measured in real time for each module within the chip 100. In one aspect of the invention, the power analyzer module 119 may be adapted to output a clock signal 145 and a data signal 147. The data signal 147 may comprise sequential power status information related to modules within the chip 100. The data signal 147 and the clock signal 145 may be communicated outside the chip 100 for further processing.

Figure 2:
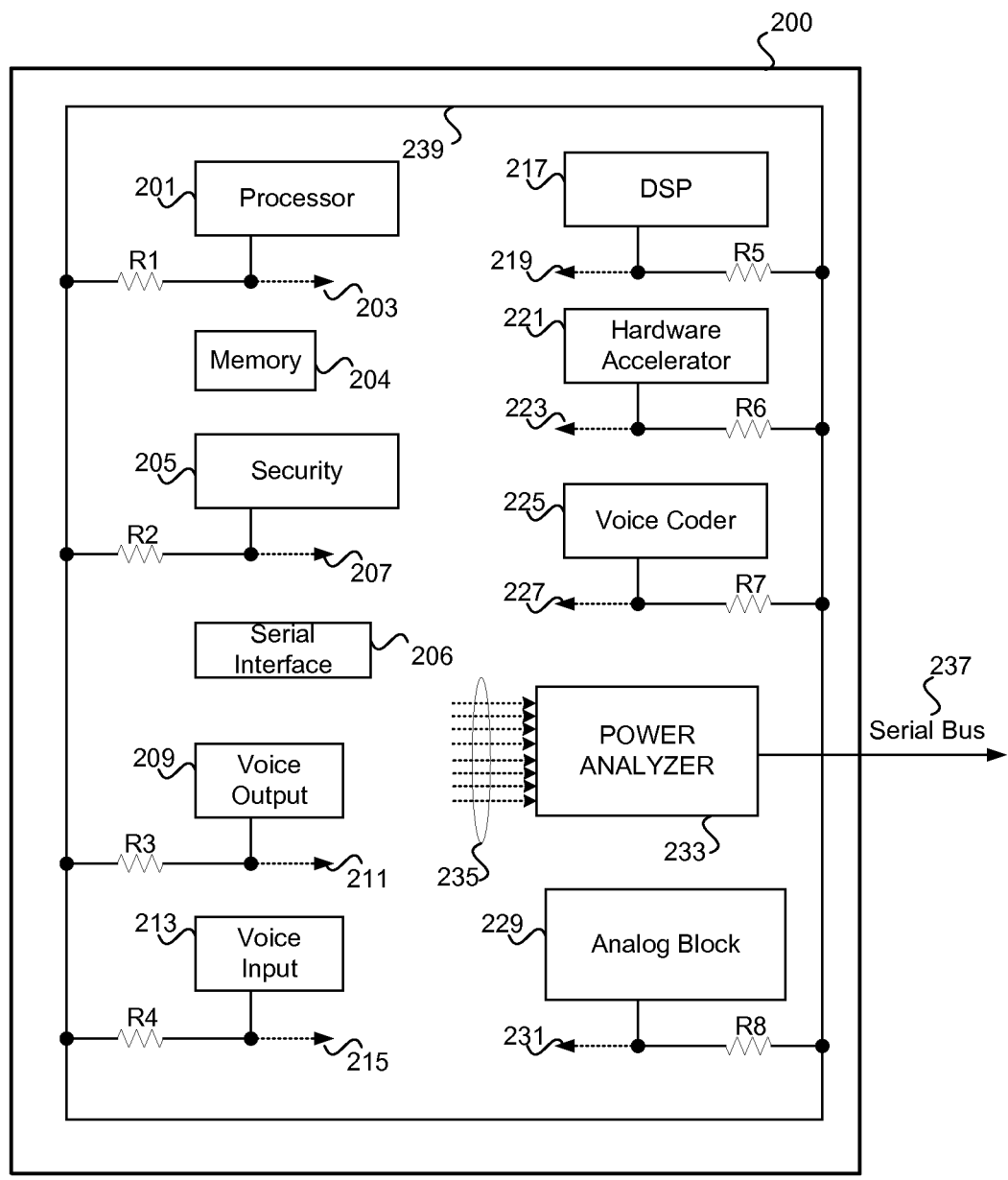
FIG. 2 is a block diagram of the exemplary chip architecture of FIG. 1 utilizing power status output via a serial bus, in accordance with an embodiment of the invention.

FIG. 2 is a block diagram of the exemplary chip architecture of FIG. 1 utilizing power status output via a serial bus, in accordance with an embodiment of the invention. Referring to FIG. 2, the chip 200 may comprise a processor 201, a digital signal processor (DSP) 217, memory 204, a hardware accelerator module 221, a security module 205, a voice coder module 225, a serial interface 206, a power analyzer module 233, a voice output module 209, a voice input module 213, an analog processing module 229, resistor drops 203, 207, 211, 215, 219, 223, 227 and 231, and a power rail 239 for supplying power to all modules within the chip 200. For example, the power rail 239 may supply power to the processor 201, the security module 205, the voice output module 209, the voice input module 213, the DSP 217, the hardware accelerator 221, the voice coder module 225 and the analog block 229. Power status information 235 may be communicated to the power analyzer module 233 from each of the resistor drops 203, 207, 211, 215, 219, 223, 227 and 231.

In one aspect of the invention, resistor drops may be utilized to measure power status within the chip 100. For example, resistors R1, R2, R3, R4, R5, R6, R7 and R8 may be utilized with resistor drops 203, 207, 211, 215, 219, 223, 227 and 231, respectively. The resistor drops 203, 207, 211, 215, 219, 223, 227 and 231 may be adapted to measure the power status and power consumption in real time within the processor 201, the security module 205, the voice output module 209, the voice input module 213, the DSP 217, the hardware accelerator 221, the voice coder module 225 and the analog block 229, respectively. Power status information 235 from each of the resistor drops 203, 207, 211, 215, 219, 223, 227 and 231 may be communicated to the power analyzer module 233 for further processing.

In a different aspect of the invention, after the power analyzer module 233 receives the power status information 235, the power status information 235 may be communicated outside via a serial bus connection 237. A "round robin" scheme may be utilized where the power analyzer module 233 outputs consecutive power status information for specific modules within the chip 200, so that power status information for all power-consuming modules within the chip 200 may be outputted via the serial bus 237 for a determined period of time.

Figure 3:
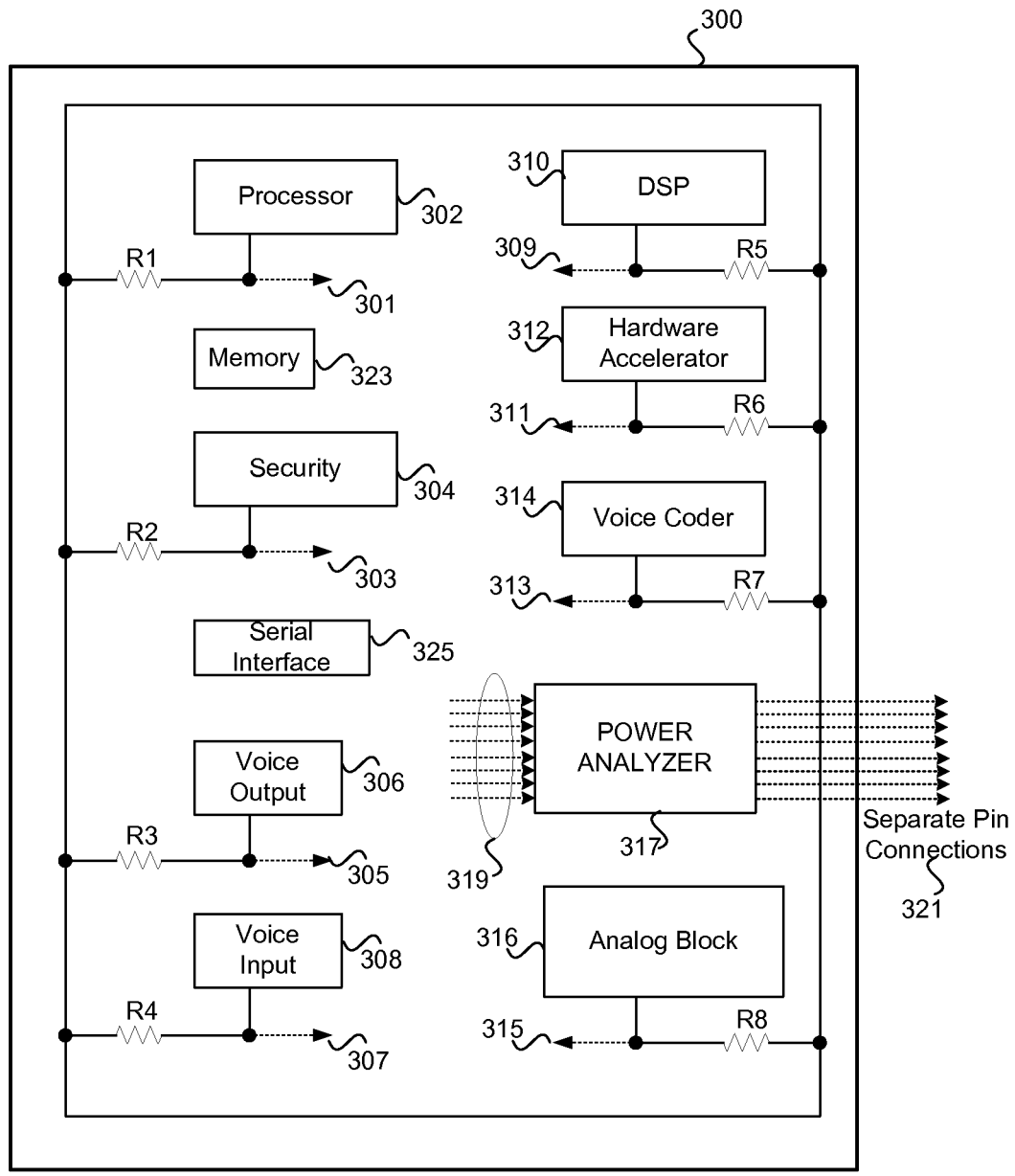
FIG. 3 is a block diagram of the exemplary chip architecture of FIG. 1 utilizing power status output via separate pin connections, in accordance with an embodiment of the invention.

FIG. 3 is a block diagram of the exemplary chip architecture of FIG. 1 utilizing power status output via separate pin connections, in accordance with an embodiment of the invention. Referring to FIG. 3, the chip 300 may comprise a processor 302, a digital signal processor (DSP) 310, memory 323, a hardware accelerator module 312, a security module 304, a voice coder module 314, a serial interface 325, a power analyzer module 317, a voice output module 306, a voice input module 308, an analog processing module 316, resistor drops 301, 303, 305, 307, 309, 311, 313 and 315. Power status information 319 may be communicated to the power analyzer module 317 from each of the resistor drops 301, 303, 305, 307, 309, 311, 313 and 315.

In one aspect of the invention, resistor drops 301, 303, 305, 307, 309, 311, 313 and 315 may be utilized to measure power status within the chip 300. For example, resistors R1, R2, R3, R4, R5, R6, R7 and R8 may be utilized with resistor drops 301, 303, 305, 307, 309, 311, 313 and 315, respectively. The resistor drops 301, 303, 305, 307, 309, 311, 313 and 315 may be adapted to measure the power status and power consumption in real time within the processor 302, the security module 304, the voice output module 306, the voice input module 308, the DSP 310, the hardware accelerator 312, the voice coder module 314 and the analog block 316, respectively. Power status information 319 from each of the resistor drops 301, 303, 305, 307, 309, 311, 313 and 315 may be communicated to the power analyzer module 317 for further processing. After the power analyzer module 317 receives the power status information 319, the power status information 319 may be communicated outside the chip 300 via separate pin connections 321. Each of the separate pin connections 321 may be indicative of power status for a single module within the chip 300.

Figure 4:
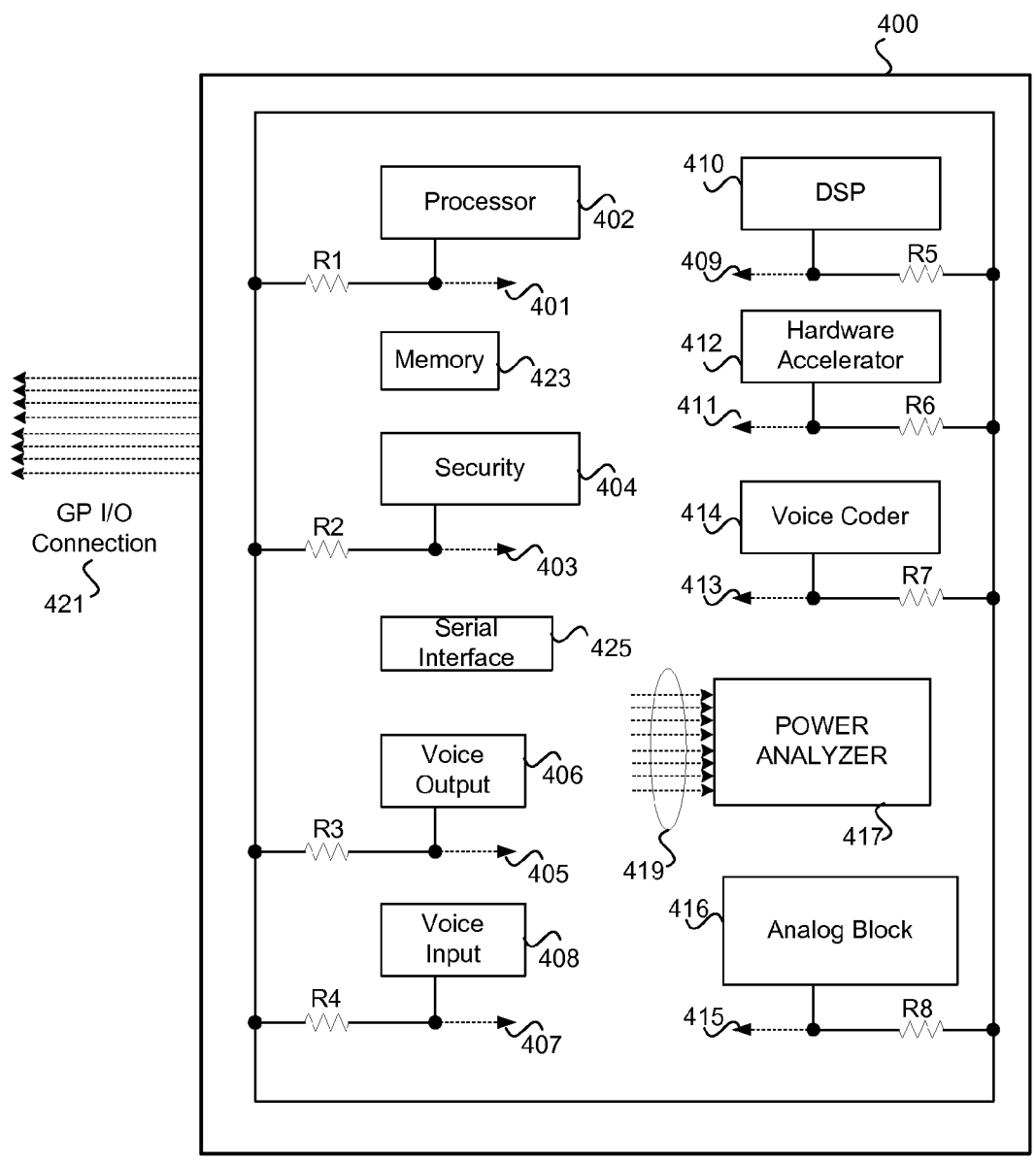
FIG. 4 is a block diagram of the exemplary chip architecture of FIG. 1 utilizing power status output via a general purpose input/output connection, in accordance with an embodiment of the invention.

FIG. 4 is a block diagram of the exemplary chip architecture of FIG. 1 utilizing power status output via a general purpose input/output connection, in accordance with an embodiment of the invention. Referring to FIG. 4, the chip 400 may comprise a processor 402, a digital signal processor (DSP) 410, memory 423, a hardware accelerator module 412, a security module 404, a voice coder module 414, a serial interface 425, a power analyzer module 417, a voice output module 406, a voice input module 408, an analog processing module 416, resistor drops 401, 403, 405, 407, 409, 411, 413 and 415. Power status information 419 may be communicated to the power analyzer module 417 from each of the resistor drops 401, 403, 405, 407, 409, 411, 413 and 415.

In one aspect of the invention, the resistor drops 401, 403, 405, 407, 409, 411, 413 and 415 may be utilized to measure power status within the chip 400. For example, resistors R1, R2, R3, R4, R5, R6, R7 and R8 may be utilized with resistor drops 401, 403, 405, 407, 409, 411, 413 and 415, respectively. The resistor drops 401, 403, 405, 407, 409, 411, 413 and 415 may be adapted to measure the power status and power consumption in real time within the processor 402, the security module 404, the voice output module 406, the voice input module 408, the DSP 410, the hardware accelerator 412, the voice coder module 414 and the analog block 416, respectively. Power status information 419 from each of the resistor drops 401, 403, 405, 407, 409, 411, 413 and 415 may be communicated to the power analyzer module 417 for further processing. After the power analyzer module 417 receives the power status information 419, the power status information 419 may be communicated outside the chip 400 via a general purpose input/output (GPIO) connection 421. The GPIO 421 may be coupled to a multiplexer within the chip 400 so that output of power status information may be accomplished via the GPIO 421.

Figure 5:
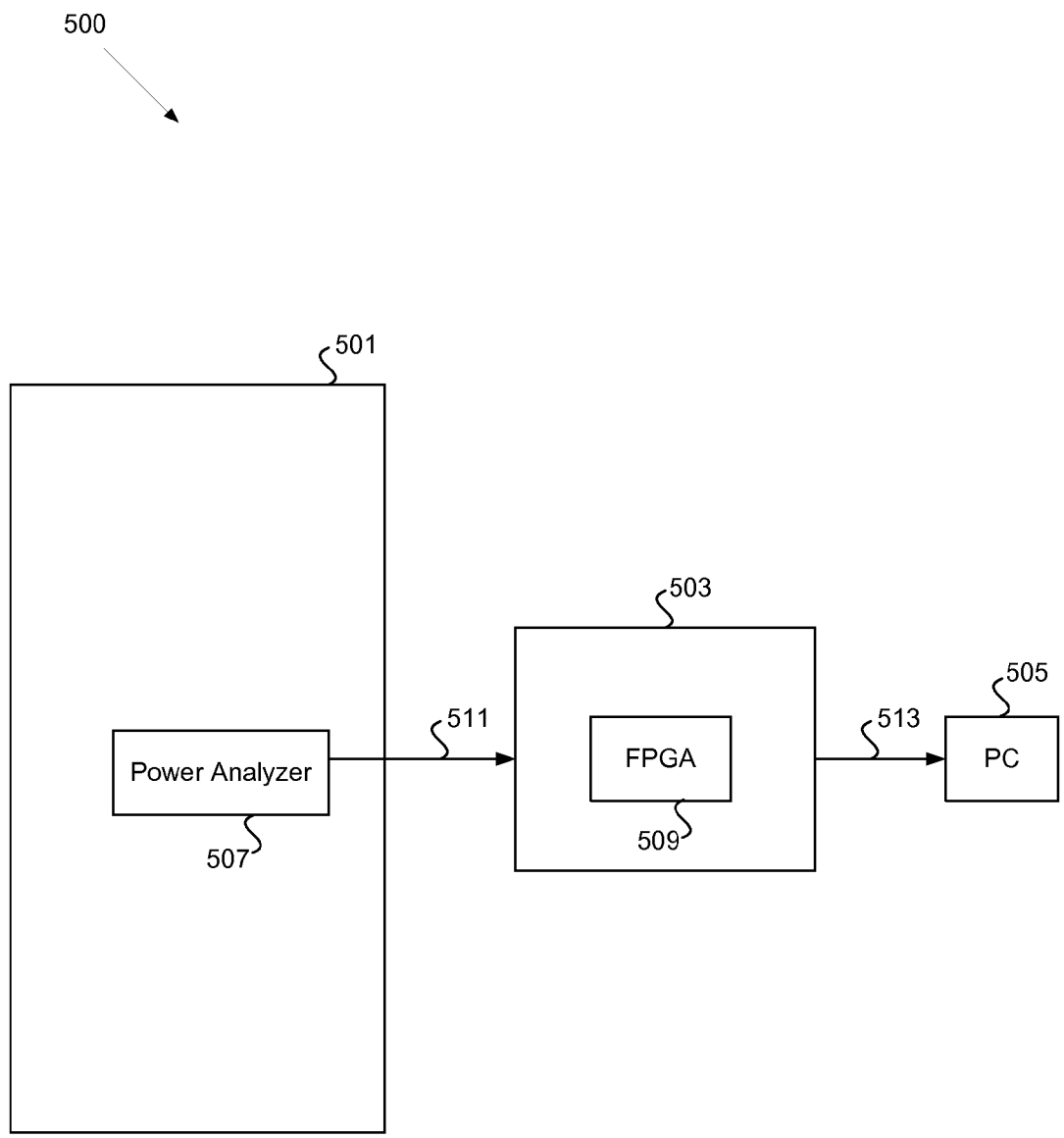
FIG. 5 is a block diagram of an exemplary system utilizing power status monitoring, in accordance with an embodiment of the invention.

FIG. 5 is a block diagram of an exemplary system utilizing power status monitoring, in accordance with an embodiment of the invention. Referring to FIG. 5, the system 500 may comprise a chip 501, an interface 503 and a processing device 505. The chip 501 may be adapted for use in a wireless handset and may be similar to the chip 100 illustrated on FIG. 1.

The chip 501 may comprise a power analyzer module 507. The power analyzer module 507 may comprise suitable circuitry, code and/or logic and may be adapted to receive power status information related to modules within the chip 501. In addition, the power analyzer module 507 may communicate the received power status information to the interface 503 via the connection 511. The connection 511 may comprise a serial bus, for example.

The interface 503 may comprise a programmable processor 509. The programmable processor 509 may comprise a field programmable gate entry (FPGA), for example. The interface 503 may also comprise an application-specific integrated circuit (ASIC). The interface 503 may be adapted to pre-process the power status information received from the chip 501 so that it may be further processed by the processing device 505. The pre-processed power status information may be communicated form the interface 503 to the processing device 505 via the connection 513. The connection 513 may comprise a serial bus, for example.

The processing device 505 may comprise a PC and may be adapted to process the power status information received from the interface 503. In one aspect of the invention, the processing device 505 may display a list with a determined number of devices within the chip 501 with their respective power status information. For example, the processing device 505 may display a list of the top ten power-consuming modules within the chip 501 and the exact power that was, or is being, consumed. In one aspect of the invention, real-time power status information may be collected by the power analyzer module 507 within the chip 501 and communicated to the processing device 505 via the interface 503.

In a different aspect of the invention, the processing device 505 may provide visual indication of the amount of power being consumed by one or more modules coupled to the chip 501. The visual indication may include one or more LEDs.

Figure 6:
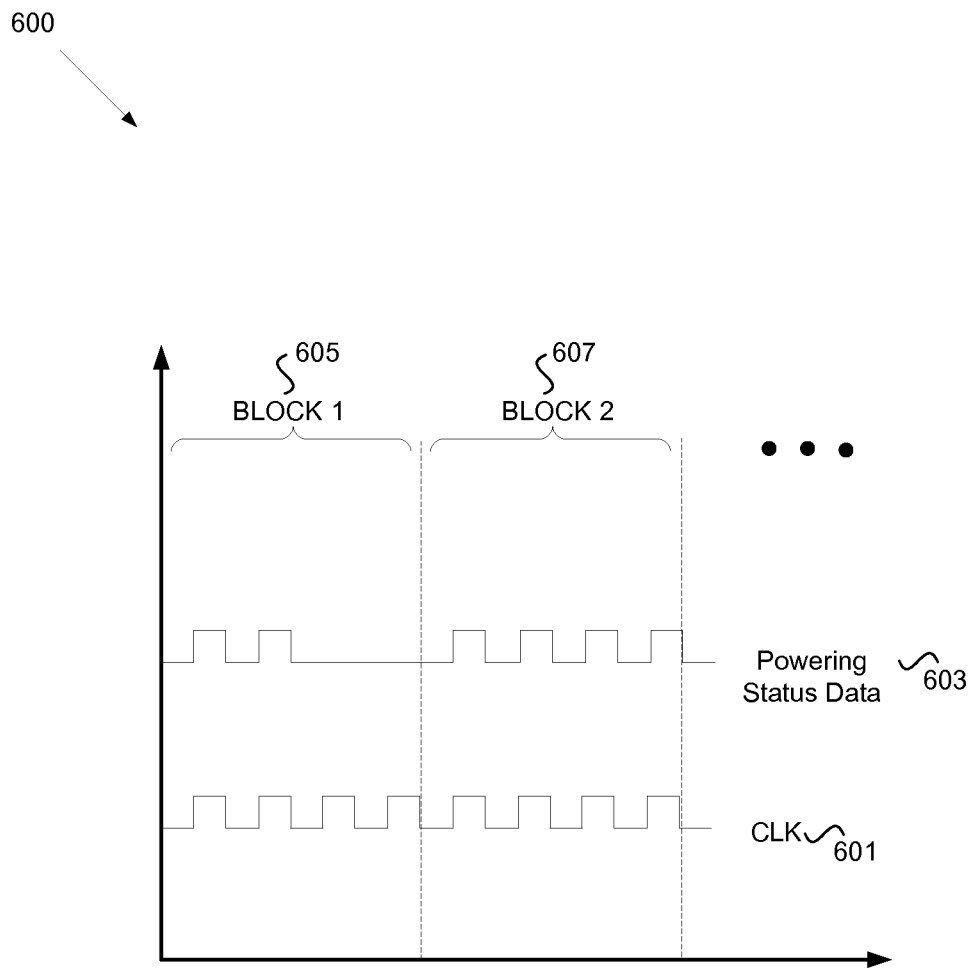
FIG. 6 is a timing diagram illustrating exemplary power status timing, in accordance with an embodiment of the invention.

FIG. 6 is a timing diagram 600 illustrating exemplary power status timing, in accordance with an embodiment of the invention. The graphical diagram 600 illustrates a timing diagram of a clock signal 601 and power status data 603. In one aspect of the invention, a power analyzer module, for example, within a chip may receive power status information related to modules within the chip. The power analyzer module may then output the power status data and a clock signal for further processing outside the chip. The power status data and the clock signal may be characterized by the timing diagrams 603 and 601, respectively.

In one aspect of the invention, a determined number of clock cycles may represent the power status of a specific block within the chip. For example, current power consumption within a specific block may be associated with a determined number of active bits. In this way, the power status data 603 may represent power consumption for a first block 605 and for a second block 607 within the chip. Each block within the chip may be associated with four bits, for example. Since the second block 607 contains four active bits and the first block 605 contains two active bits, it may be determined that the second block 607 is currently consuming more power than the first block 605.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for monitoring operating status of a device, the method comprising:
   receiving at a power analyzer implemented within a chip, a plurality of signals, each of said plurality of signals being indicative of a power status of a respective one of a plurality of on-chip devices; and
   generating from the power analyzer within said chip, a corresponding plurality of output signals, each of said corresponding plurality of output signals respectively being indicative of said power status of said respective one of said plurality of on-chip devices, wherein each of said corresponding plurality of output signals comprises a clock signal and a data signal.

2. The method according to claim 1, further comprising outputting from said chip in a round robin manner, said corresponding plurality of output signals that are indicative of said power status.

3. The method according to claim 1, further comprising measuring in real time by one or more resistor drops within said chip, each of said plurality of output signals that are indicative of said power status.

4. The method of claim 1, further comprising communicating said corresponding plurality of output signals outside said chip.

5. The method of claim 1, further comprising communicating said corresponding plurality of output signals via a plurality of pin connections on said chip.

6. The method of claim 4, further comprising communicating said corresponding plurality of output signals via a general purpose input/output connection.

7. The method of claim 1, further comprising communicating said corresponding plurality of output signals via a serial bus.

8. The method of claim 1, wherein said data signal comprises sequential power status information for said plurality of on-chip devices.

9. The method of claim 1, further comprising, after acquiring a first signal indicative of a power status of a first one of said plurality of on-chip devices, acquiring a second signal indicative of a power status of a second one of said plurality of on-chip devices.

10. The method of claim 9, further comprising determining a difference between said first signal and said second signal.

11. The method of claim 10, further comprising reporting said determined difference, if said determined difference is non-zero.

12. The method according to claim 10, further comprising reporting said second signal if said determined difference is non-zero.

13. A system for monitoring operating status of a device, the system comprising:
   a power analyzer, implemented within a chip, configured to receive a plurality of signals, each of said plurality of signals being indicative of a power status of a respective one of a plurality of on-chip devices; wherein
   the power analyzer is configured to generate from within said chip, a corresponding plurality of output signals, each of said corresponding plurality of output signals respectively being indicative of said power status of said respective one of said plurality of on-chip devices, wherein each of said corresponding plurality of output signals comprises a clock signal and a data signal.

14. The system according to claim 13, wherein the power analyzer is configured to output from said chip in a round robin manner, said corresponding plurality of output signals that are indicative of said power status.

15. The system according to claim 13, wherein the power analyzer is configured to measure in real time using one or more resistor drops within said chip, each of said plurality of output signals that are indicative of said power status.

16. The system of claim 13, wherein the power analyzer is configured to communicate said corresponding plurality of output signals outside said chip.

17. The system of claim 16, wherein the power analyzer is configured to communicate said corresponding plurality of output signals via a general purpose input/output connection.

18. The system of claim 13, wherein the power analyzer is configured to communicate said corresponding plurality of output signals via a serial bus.

19. The system of claim 13, wherein the power analyzer is configured to communicate said corresponding plurality of output signals via a plurality of pin connections on said chip.

20. The system of claim 13, wherein said data signal comprises sequential power status information for said plurality of on-chip devices.

21. The system of claim 13, wherein the power analyzer is configured to acquire a first signal indicative of a power status of a first one of said plurality of on-chip devices, and then acquire a second signal indicative of a power status of a second one of said plurality of on-chip devices.

22. The system of claim 21, wherein the power analyzer is configured to determine a difference between said first signal and said second signal.

23. The system of claim 22, wherein the power analyzer is configured to report said determined difference, if said determined difference is non-zero.

24. The system according to claim 22, wherein the power analyzer is configured to report said second signal if said determined difference is non-zero.

* * * * *